US006274440B1

(12) United States Patent
Arndt et al.

(10) Patent No.: US 6,274,440 B1
(45) Date of Patent: *Aug. 14, 2001

(54) MANUFACTURING OF CAVITY FUSES ON GATE CONDUCTOR LEVEL

(75) Inventors: Kenneth C. Arndt; Axel C. Brintzinger, both of Fishkill; Richard A. Conti, Mt. Kisco; Donna R. Cote, Poughkeepsie; Chandrasekhar Narayan, Hopewell Junction; Ravikumar Ramachandran, Beacon; Thomas S. Rupp, Stormville; Senthil K. Srinivasan, Wappingers Falls, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/282,134

(22) Filed: Mar. 31, 1999

(51) Int. Cl.[7] ................................................. H01L 21/336
(52) U.S. Cl. ........................... 438/281; 438/333; 438/589
(58) Field of Search ...................... 438/281, 333, 438/589

(56) References Cited

U.S. PATENT DOCUMENTS

| 3,359,462 | 12/1967 | Schutze et al. ........................ 257/533 |
| 4,032,949 | 6/1977 | Bierig .................................... 257/529 |
| 4,209,894 | 7/1980 | Keen ..................................... 438/467 |
| 4,460,914 | 7/1984 | te Velde et al. ...................... 257/529 |
| 4,472,239 | 9/1984 | Johnson et al. ........................ 438/49 |
| 4,536,948 | 8/1985 | Te Velde et al. ..................... 438/601 |
| 4,879,587 | * 11/1989 | Jerman et al. ........................ 257/529 |
| 4,908,692 | * 3/1990 | Kikuchi et al. ....................... 257/419 |
| 5,812,046 | * 9/1998 | Brown et al. .......................... 337/290 |
| 5,895,262 | * 4/1999 | Becker et al. ........................ 438/601 |
| 5,899,736 | * 5/1999 | Weigand et al. ..................... 438/601 |
| 5,970,346 | * 10/1999 | Liaw .................................... 438/281 |
| 6,060,398 | * 5/2000 | Brintzinger et al. ................. 438/696 |

FOREIGN PATENT DOCUMENTS

| 0 903 784 A2 | 3/1999 | (EP) . |
| 0 942 462 A2 | 9/1999 | (EP) . |
| 2 321 780 A | 8/1998 | (GB) . |

* cited by examiner

Primary Examiner—Wael Fabury, Jr.
Assistant Examiner—William M. Brewster
(74) Attorney, Agent, or Firm—McGinn & Gibb, PLLC; Steven Capella, Esq.

(57) ABSTRACT

A structure and method for making a cavity fuse over a gate conductor stack. The method includes providing a semiconductor substrate having a gate conductor stack over a shallow trench isolation region, forming oxide layers on the substrate about the gate conductor stack, etching electrical contact holes through the oxide layers to the substrate, filling the electrical contact holes with a first conductive material to establish electrical contact with the gate conductor stack, etching a pattern in an uppermost oxide layer of the oxide layers, depositing a conductive layer of a second conductive material over the oxide layers and the electrical contacts, planarizing the conductive layer whereby the conductive material remains only in the pattern, anisotropically etching the oxide layers to form at least one etching hole through the oxide layers to the shallow trench isolation region, and isotropically etching at least a portion of the oxide layers about the etching hole, whereby a cavity is formed beneath at least a portion of the conductive layer pattern, the gate conductor stack comprising a fuse.

16 Claims, 4 Drawing Sheets

MANUFACTURING OF CAVITY FUSES ON GATE CONDUCTOR LEVEL

BACKGROUND OF THE INVENTION

1. Field of the Invention

The present invention generally relates to fuses within semiconductor devices and more particularly to an improved method of forming a structure having a cavity around a gate stack conductor fuse.

2. Description of the Related Art

Semiconductor integrated circuits (IC) and their manufacturing techniques are well known. In a typical integrated circuit, a large number of semiconductor devices may be fabricated on a silicon substrate. To achieve the desired functionality, a plurality of conductors are typically provided to couple selected devices together. In some integrated circuits, conductive links are coupled to fuses, which may be cut or blown after fabrication using lasers or excessive current/voltage.

In a dynamic random access memory (DRAM) circuit, for example, fuses may be employed during manufacturing to protect some of the transistors' gate stacks from destruction due to inadvertent built-up of charges. Once fabrication of the IC is substantially complete, the fuses may be blown or cut to permit the DRAM circuit to function as if the protective current paths never existed.

Fusible links generally comprise metal lines that can be explosively fused open by application of excessive energy which causes a portion of the link material to vaporize and a portion to melt. Typically, the fusible link is thin and is made of aluminum or polysilicon. Alternatively, the fuse link may be made of the same metals as the chip conductors.

The increasing speed requirements of logic chips are the driving force behind these fusible link materials. More commonly, fuses may be employed to set the enable bit and the address bits of a redundant array element in a DRAM circuit.

FIG. 1 illustrates a typical dynamic random access memory integrated circuit, having a main memory array 102. To facilitate replacement of a defective main array element within the main memory array 102, a redundant array 104 is provided as shown. A plurality of fuses in a fuse array 106 are coupled to redundant array 104 via a fuse latch array 108 and a fuse decoder circuit 110. To replace a defective main memory array element, individual fuses in the fuse array 106 may be blown or cut to set their values to either a "1" or a "0" as required by the decoder circuit.

During operation, the values of the fuses in the fuse array 106 are typically loaded into a fuse latch array 108 upon power up. These values are then decoded by fuse decoder circuit 110 during run time, thereby facilitating the replacement of specific failed main memory array elements with specific redundant elements of redundant array 104. Techniques for replacing failed main memory array elements with redundant array elements are well known in the art and will not be discussed in great detail herein.

As mentioned above, the fuse links within the fuse array 106 may be selectively blown or cut with a laser beam or excess current/voltage. Once blown the fuse changes from a highly conductive state to a highly resistive (i.e., non-conductive) state. A blown fuse inhibits current from flowing through and represents an open circuit to the current path. With reference to FIG. 2A, fuse links 202, 204, 206, and 208 of the fuse array element 106 are shown in their unblown (i.e., conductive) state. In FIG. 2B, fuse link 204 has been blown ("opened"), thereby inhibiting the flow of current therethrough.

However, if the fuse link material is not sufficiently dispersed within the surrounding area, the fuse link may still represent a conductive path even after it is theoretically blown. In other words, especially with electrically blown fuses, the fuse blow is sometimes unreliable. Therefore, cavities or areas of adsorption material are often placed adjacent the fuse link material to provide a location for the melted and vaporized material to disburse.

SUMMARY OF THE INVENTION

It is therefore an object of the present invention to provide a structure and method for making a cavity fuse over a gate conductor stack. The method includes providing a semiconductor substrate having a gate conductor stack over a shallow trench isolation region, forming oxide layers on the substrate about the gate conductor stack, etching electrical contact holes through the oxide layers to the substrate, filling the electrical contact holes with a first conductive material to establish electrical contact with the gate conductor stack, etching a pattern in an uppermost oxide layer of the oxide layers, depositing a conductive layer of a second conductive material over the oxide layers and the electrical contacts, planarizing the conductive layer whereby the conductive material remains only in the pattern, anisotropically etching the oxide layers to form at least one etching hole through the oxide layers to the shallow trench isolation region, and isotropically etching at least a portion of the oxide layers about the etching hole, whereby a cavity is formed beneath at least a portion of the conductive layer pattern, the gate conductor stack comprising a fuse.

The anisotropical etching is preferably a dry etch and the isotropical etching is preferably a wet etch. Further, the isotropic etching etches the oxide layers at a faster rate than it etches the semiconductor substrate, the gate conductor stack, the first conductive material or the second conductive material. Thus, the cavity is bounded by the semiconductor substrate, the first conductive material and the second conductive material. In other words, isotropic etching forms the cavity to completely surround the gate conductor stack, such that the gate conductor stack is suspended from one portion of the semiconductor substrate to another portion of the semiconductor substrate within the cavity.

After the isotropic etching, an insulator is deposited over the second conductive layer to seal the etching holes. In addition, the oxide layers may be layers of BPSG and/or TEOS. Also, the first conductor may be polysilicon and the second conductor may be tungsten.

Another embodiment of the invention is a method for forming a fuse and includes forming a fuse element on a substrate, forming at least one insulator on the substrate and the conductor, forming a seal above the insulator, forming at least one opening through the seal and the insulator; and etching the insulator through the opening to form a cavity adjacent the fuse element, where the cavity is bounded by the substrate and the seal.

The method may also include forming at least one contact opening in the insulator and filling the contact opening with a conductor such that the conductor makes electrical contact with the fuse element. The forming of the seal includes forming a patterned conductive layer over the insulator, such that the patterned conductive layer is electrically connected to the conductor. The conductor and the patterned conductive layer make up the seal. Thus, the substrate and the seal combine to surround the fuse element, such that the etching leaves the substrate and the seal to form the cavity.

The fuse element may be a gate conductor over a shallow trench isolation region within the substrate. The etching removes the shallow trench isolation region and forms the cavity to completely surround the gate conductor, such that the gate conductor is suspended from one portion of the substrate to another portion of the substrate within the cavity.

The forming of the opening comprises a dry etch and the etching of the insulator comprises an wet etch. The etching etches the insulator at a faster rate than it etches the substrate, the fuse element or the seal, such that the cavity is bounded by the substrate and the seal. After the etching, a second insulator is deposited over the seal to seal the opening.

Another embodiment of the invention is a fuse structure that includes a substrate, a gate conductor stack above the substrate, at least one conductive contact on the substrate, a conductive pattern above the gate conductor stack and connected to the conductive contact and a cavity surrounding the gate conductor stack bounded by the substrate, the conductive contact and the conductive pattern, wherein the conductive pattern includes at least one etching opening for forming the cavity.

The cavity extends into the substrate, such that the gate conductor is suspended from one portion of the substrate to another portion of the substrate within the cavity. The structure may also include an insulator sealing the opening.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

The invention, described in detail below, includes a unique method of forming a cavity around a gate conductor stack (which is utilized as a fuse link) and the associated unique structure. More specifically, with the invention wet etching of insulator layers surrounding the fuse link is performed through holes in the upper surface of the cavity region. This method simplifies the cavity formation process and allows much smaller integrated circuit features (such as gate stack structures which are utilized as fuse links) to include cavities.

Figure 1:
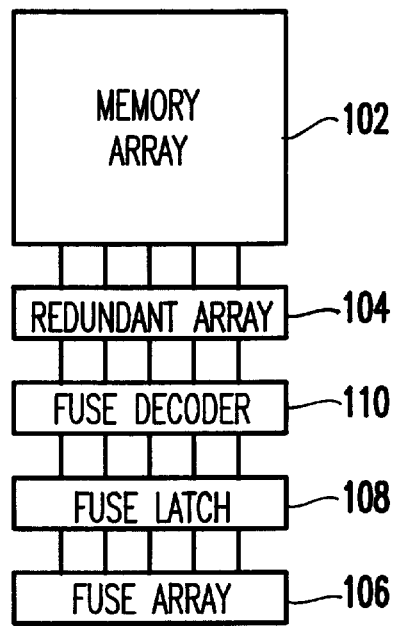
FIG. 1 is a schematic drawing of a memory array and associated components.
Figure 2A:
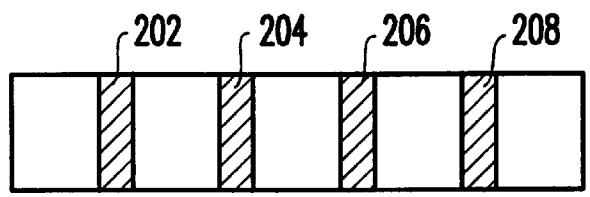
FIGS. 2A and 2B are schematic drawings of fuse links.
Figure 2B:
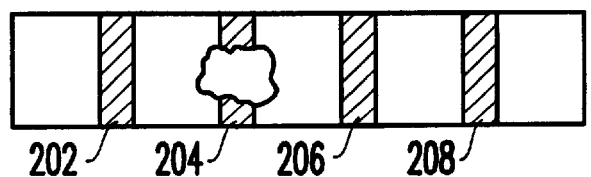
Figure 3:
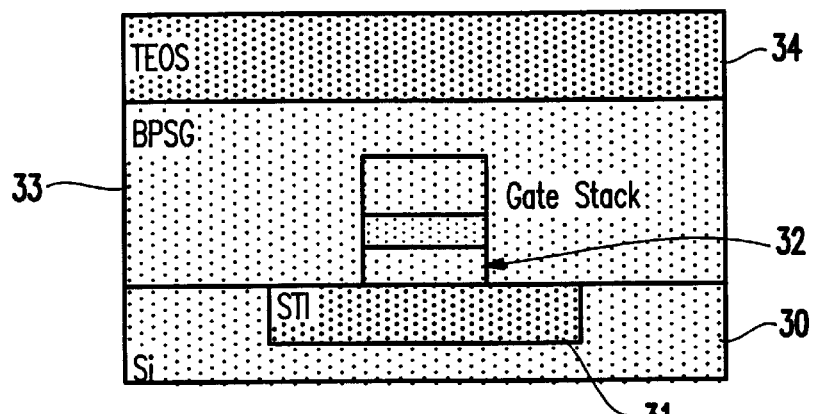
FIG. 3 is a cross-sectional schematic view of a partially completed fuse structure according to the invention.

Referring now to FIGS. 3–8, the method and structure of the invention will be explained in detail. More specifically, FIG. 3 illustrates a substrate 30 in which a shallow trench isolation (STI) region 31 has been formed. The substrate 30 could comprise any standard substrate, such as a silicon substrate and the shallow trench isolation region 31 could similarly comprise any conventional isolation material, such as tetraethylorthosilicate (TEOS), as is well known to those ordinarily skilled in the art.

A gate stack 32 is formed over the shallow trench isolation region 31 and could comprise, for example a series of insulating and conductive layers as is well known in the art. The insulating layers could comprise, for example, oxide and nitride materials and the conductive layers could comprise metal, alloy, polysilicon, and other well-known conductors.

The shallow trench isolation region 31 and the gate stack 32 are formed using well known conventional methods including various deposition methods, such as chemical vapor deposition (CVD) and sputtering and many patterning and etching methods such as lithographic masking and etching including isotopic and anisotropic wet and dry etching as is well known to those ordinarily skilled in the art.

One or more insulator layers 33, 34 are formed over the substrate/gate stack structure 30–32. For example, a layer of boron phosphorous silicate glass (BPSG) 33 and a layer of TEOS 34 could be formed over the substrate/gate structure 30–32, and shown in FIG. 3. Chemical vapor deposition (CVD) and common planarization techniques such as chemical mechanical polishing (CMP) can be used to deposit and planarize the insulators 33, 34 shown in FIG. 3.

Figure 4:
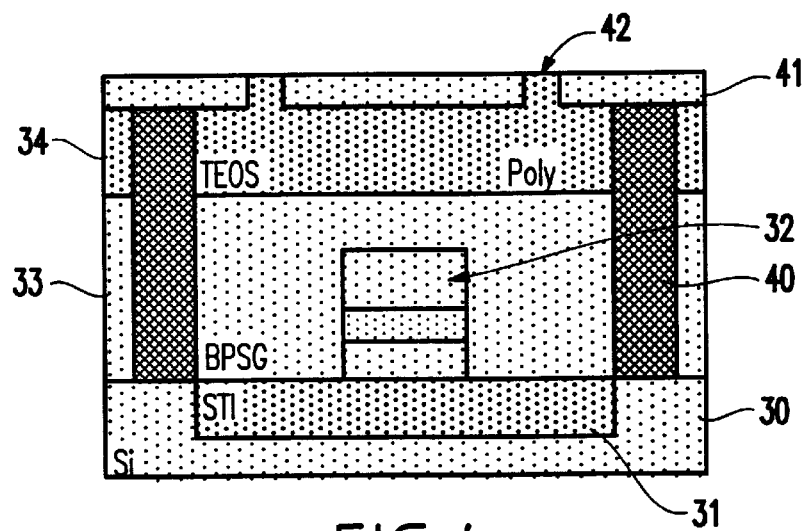
FIG. 4 is a cross-sectional schematic view of a partially completed fuse structure according to the invention.

Referring now to FIG. 4, contacts lines 40 are opened within the insulating layer 33, 34 and are filled with a conductive material. As shown in greater detail in FIG. 7, the contacts 40 form a box or open cube structure around a portion of the gate stack 32. The contacts 40 make electrical contact with the substrate 30 and the gate stack 32, as shown more clearly in the cut-away view in FIG. 7. The material used for the contacts 40 could comprise any conductive material such as a metal, alloy or polysilicon, and in a preferred embodiment comprises polysilicon deposited using a CVD process.

Subsequently, a conductive layer 41 is formed over the structure and is patterned to include openings 42. The conductive layer 41 is in electrical contact with the gate stack structure 30–32 through the contacts 40. The conductor 41 could comprise any standard conductor, such as those described above, and in a preferred embodiment comprises tungsten deposited using a sputtering process.

Figure 5:
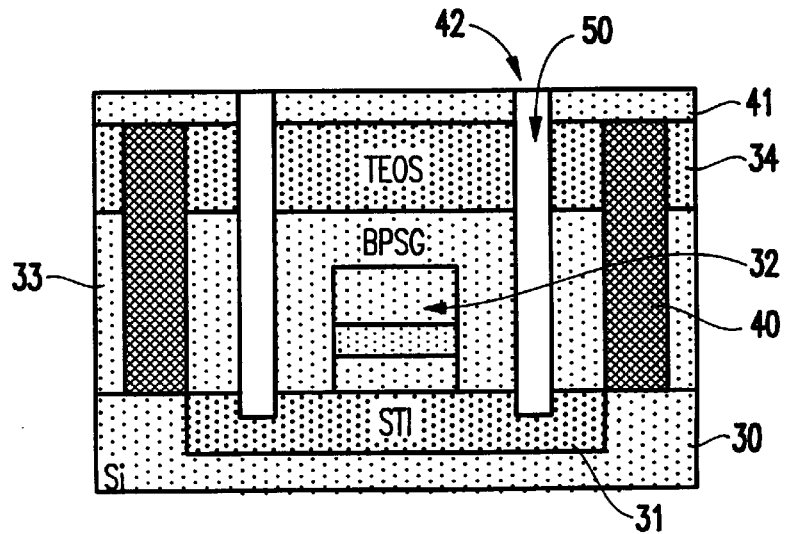
FIG. 5 is a cross-sectional schematic view of a partially completed fuse structure according to the invention.

Column openings 50 are formed through the insulator layers 33, 34 and into the shallow trench isolation region 31, as shown in FIG. 5. The column openings 50 are formed directly below the openings 42 and could be formed using a number of conventional methods, as would be well known by one ordinarily skilled in the art given this disclosure. For example, the column openings 50 could be formed in a dry etch using $C_4F_8$ and oxygen gas applied through the openings 42. As shown more clearly in FIG. 7, the column openings 50 comprise small narrow columns within the insulating layers 33, 34 and shallow trench isolation region 31.

Figure 6:
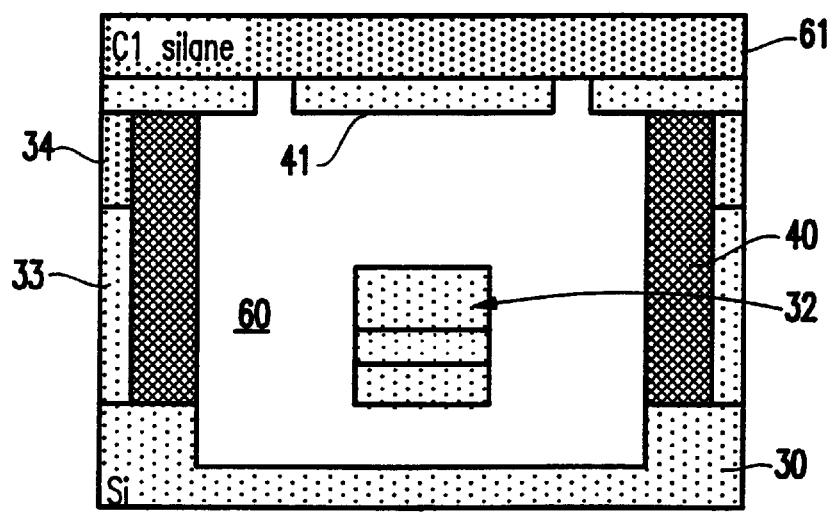
FIG. 6 is a cross-sectional schematic view of a completed fuse structure according to the invention.

As shown in FIG. 6 a different etch, such as a wet etch using buffered HF (or diluted HF) solution is applied to the insulating layers 33, 34 and the shallow trench isolation region 31 through the column openings 50. The wet etch through the openings 42, 50 produces a cavity 60 surrounding the gate conductor stack 32. This additional wet etch is necessary in order to create the required undercut (e.g., cavity below the tungsten plate and above the gate conductor line). Without the cavity the subsequent deposition process would refill the openings 50.

Figure 7:
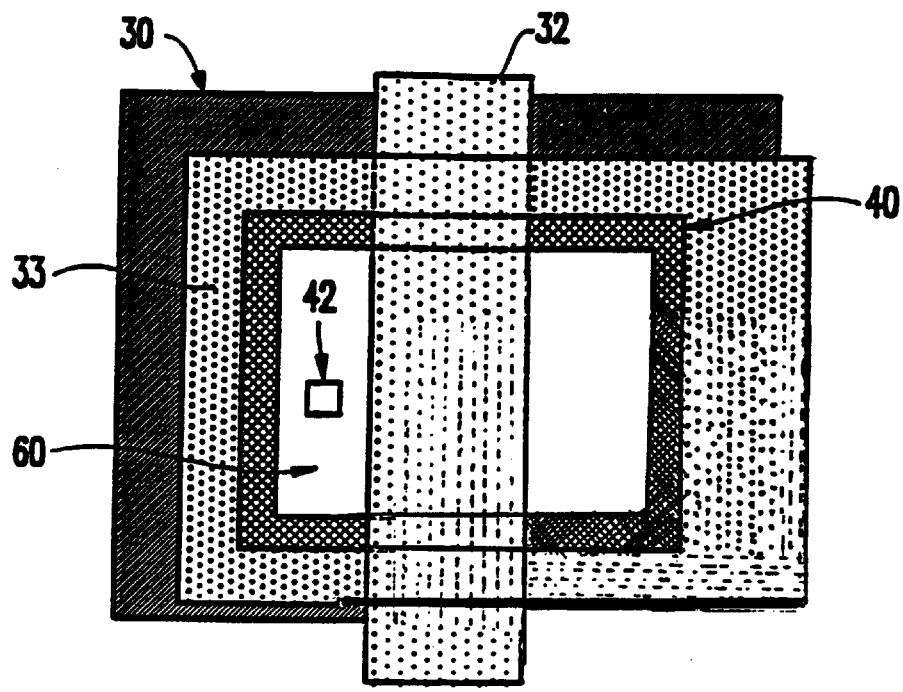
FIG. 7 is a top schematic view of a completed fuse structure according to the invention.

As shown more clearly in FIG. 7, the gate conductor stack 32 is suspended within the cavity 60 and rests on the edge of portions of the substrate/shallow trench isolation regions 30, 31.

The contacts 40 and the conductive layer 41 in combination with the substrate 30 form a box within which the cavity 60 is formed. Therefore, the contacts 40 and conductive layer 41 act as a shield to limit the amount of insulator 30, 31 which is removed by the wet etch through the openings 42.

After the cavity 60 is formed, the openings 42 are sealed by applying an insulator 61 over the conductive layer 41. For example, this insulator 61 could comprise silane or boron phosphorous silicate glass.

While the previous embodiments of the invention have been described with respect to a gate conductor stack structure which is utilized as a fusible link, as would be known by one ordinarily skilled in the art given this disclosure, the invention is applicable to any fusible structure. For example, the invention is equally applicable to a patterned conductive wiring structure over any form of substrate.

Figure 8:
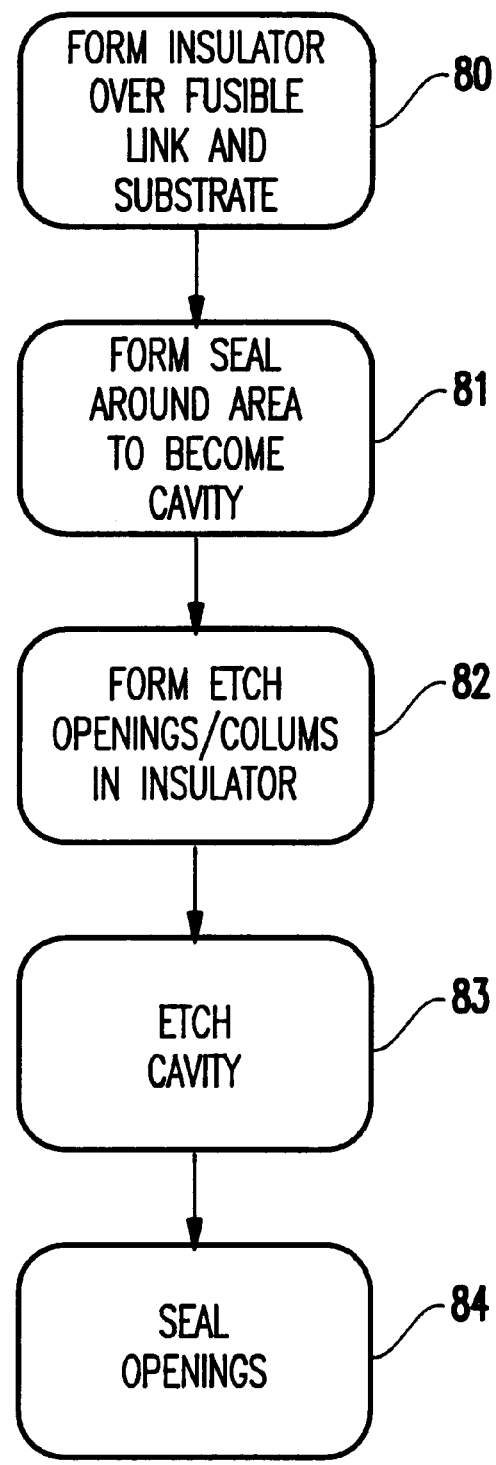
FIG. 8 is a flowchart representation of an embodiment of the invention.

A flowchart representation of the invention is shown in FIG. 8. First the insulator 33, 34 is formed over the fusible link 32 and substrate 30 as shown in item 80. Then a protective seal/shield 40, 41 is formed around the area to become the cavity 60 as shown in item 81. Openings 42 and columns 50 are formed in the top of the structure and in the insulator 33, 34. In item 83, the cavity 60 is removed using a wet etch, as described above. Finally, the openings 42 are sealed 61, as shown in item 84.

With the invention, wet etching of insulator layers surrounding the fuse link is performed through openings in the upper surface of the cavity region. This method simplifies the cavity formation process and allows much smaller integrated circuit features (such as gate stack structures which are utilized as fuse links) to include cavities. By including cavities is such small structures, the reliability of the fuse clearing operation is dramatically increased when compared to conventional structures.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method of making a cavity fuse over a gate conductor stack, said method comprising:
   (a) providing a semiconductor substrate having a gate conductor stack over a shallow trench isolation region;
   (b) forming oxide layers on said substrate about said gate conductor stack;
   (c) etching electrical contact holes through said oxide layers to said substrate;
   (d) filling said electrical contact holes with a first conductive material to establish electrical contact with said gate conductor stack;
   (e) etching a pattern in an uppermost oxide layer of said oxide layers;
   (f) depositing a conductive layer of a second conductive material over said oxide layers and said electrical contacts;
   (g) planarizing said conductive layer whereby said conductive material remains only in said pattern;
   (h) anisotropically etching said oxide layers to form a plurality of etching holes completely through said oxide layers and into said shallow trench isolation region, and
   (i) isotropically etching at least a portion of said oxide layers about said etching holes, whereby a cavity is formed beneath at least a portion of said conductive layer pattern, said gate conductor stack comprising a fuse.

2. The method in claim 1, wherein said anisotropically etching comprises a dry etch and said isotropically etching comprises a wet etch.

3. The method in claim 1, wherein said isotropically etching etches said oxide layers at a faster rate than it etches said semiconductor substrate, said gate conductor stack, said first conductive material or said second conductive material, such that said cavity is bounded by said semiconductor substrate, said first conductive material and said second conductive material.

4. The method in claim 1, wherein said isotropically etching forms said cavity to completely surround said gate conductor stack, such that said gate conductor stack is suspended from one portion of said semiconductor substrate to another portion of said semiconductor substrate within said cavity.

5. The method in claim 1, further comprising, after said isotropically etching, depositing an insulator over said second conductive layer, wherein said insulator seals said etching holes.

6. The method in claim 1, wherein said forming of said oxide layers comprises forming layers of BPSG and TEOS, said first conductor comprises polysilicon and said second conductor comprises tungsten.

7. A method of forming a fuse comprising:
   forming a fuse element on a substrate;
   forming at least one insulator on said substrate and said fuse element;
   forming a seal above said insulator;
   forming a plurality of openings completely through said seal and into said insulator; and
   etching said insulator through said opening to form a cavity adjacent said fuse element, said cavity being formed within said insulator and being bounded by said substrate and said seal.

8. The method in claim 7, further comprising forming at least one contact opening in said insulator and filling said contact opening with a conductor such that said conductor makes electrical contact with said fuse element.

9. The method in claim 8, wherein said forming of said seal comprises forming a patterned conductive layer over said insulator, such that said patterned conductive layer is electrically connected to said conductor.

10. The method in claim 9, wherein said conductor and said patterned conductive layer comprise said seal.

11. The method in claim 7, wherein said substrate, said insulator and said seal combine to surround said fuse element, such that said etching leaves said substrate, said insulator and said seal to form said cavity.

12. The method in claim 7, wherein said fuse element comprises a gate conductor over a shallow trench isolation region within said substrate and said etching removes said shallow trench isolation region and forms said cavity to completely surround said gate conductor, such that said gate conductor is suspended from one portion of said substrate to another portion of said substrate within said cavity.

13. The method in claim 7, wherein said forming of said opening comprises a dry etch and said etching of said insulator comprises an wet etch.

14. The method in claim 7, wherein said etching etches said insulator at a faster rate than it etches said substrate, said fuse element or said seal, such that said cavity is bounded by said substrate and said seal.

15. The method in claim 7, further comprising, after said etching, depositing a second insulator over said seal, wherein said second insulator seals said opening.

16. The method in claim 7, wherein said forming of said insulator comprises forming layers of BPSG and TEOS, and said seal comprises polysilicon contacts and a top tungsten layer.

* * * * *